United States Patent
Ji et al.

(10) Patent No.: US 12,456,841 B2
(45) Date of Patent: Oct. 28, 2025

(54) RF CONNECTOR CAPABLE OF PROCESSING SIGNALS IN VARIOUS FREQUENCY BANDS

(71) Applicant: KMW INC., Hwaseong-si (KR)

(72) Inventors: Kyo Sung Ji, Hwaseong-si (KR); Chi Back Ryu, Hwaseong-si (KR); Bae Mook Jeong, Suwon-si (KR); Joung-hoe Kim, Hwaseong-si (KR)

(73) Assignee: KMW INC., Hwaseong-si (KR)

( * ) Notice: Subject to any disclaimer, the term of this patent is extended or adjusted under 35 U.S.C. 154(b) by 408 days.

(21) Appl. No.: 17/992,931

(22) Filed: Nov. 23, 2022

(65) Prior Publication Data

US 2023/0080727 A1    Mar. 16, 2023

Related U.S. Application Data

(63) Continuation of application No. PCT/KR2021/006510, filed on May 25, 2021.

(30) Foreign Application Priority Data

May 26, 2020    (KR) .......................... 10-2020-0063073

(51) Int. Cl.
*H01R 13/646* (2011.01)
*H01R 12/71* (2011.01)
*H01R 13/6585* (2011.01)

(52) U.S. Cl.
CPC ......... *H01R 13/646* (2013.01); *H01R 12/712* (2013.01); *H01R 13/6585* (2013.01)

(58) Field of Classification Search
CPC .. H01R 12/712; H01R 12/716; H01R 13/646; H01R 13/4585; H01R 12/722; H01R 12/732; H01R 12/52; H01R 12/55

(Continued)

(56) References Cited

U.S. PATENT DOCUMENTS 11,652,309 B2 *    5/2023    Seo .................. H05K 1/142
                                                        439/65
2001/0027057 A1    10/2001   Okano
(Continued)

FOREIGN PATENT DOCUMENTS

| KR | 10-2012-0018057 A | 2/2012 |
| KR | 10-2014-0062810 A | 5/2014 |
| KR | 10-2019-0051533 A | 5/2019 |

OTHER PUBLICATIONS

International Search Report mailed Sep. 6, 2021 for International Application No. PCT/KR2021/006510 and its English translation.

*Primary Examiner* — Hae Moon Hyeon
(74) *Attorney, Agent, or Firm* — Insight Law Group, PLLC; Seung Lee

(57) ABSTRACT

An RF connector includes: a first printed circuit board with mounted devices; a first bridge assembly mounted adjacent to one side of the first board and including signal transmission pins; a second printed circuit board spaced apart from the first board; connection terminals adjacent to the second board contacting surfaces of the signal pins; a push bar applying force to maintain contact between the pins and terminals; and a metal shielding plate fixed to the push bar and second board, shielding portions of both. Shielding walls may be disposed between adjacent signal pins, improving isolation. The push bar has a wedge shape, creating a bending unit in the transmission pins according to lever principles. The connector transmits RF signals, power, and digital signals on the same plane, reducing size and cost while effectively processing signals in various frequency bands without expensive multi-connectors.

14 Claims, 7 Drawing Sheets

(58) Field of Classification Search
USPC .............................................. 439/65, 59, 62
See application file for complete search history.

(56) References Cited

U.S. PATENT DOCUMENTS

| | | | |
|---|---|---|---|
| 2014/0213076 A1* | 7/2014 | Ho | H01R 12/732 439/65 |
| 2016/0056556 A1* | 2/2016 | Urano | H01R 12/7076 439/65 |
| 2020/0006899 A1 | 1/2020 | Muro | |
| 2024/0098885 A1* | 3/2024 | Jeong | H05K 1/145 |

* cited by examiner (a)

(b)

(a)

(b)

(a)

(b)

(c)

RF CONNECTOR CAPABLE OF PROCESSING SIGNALS IN VARIOUS FREQUENCY BANDS

CROSS-REFERENCE TO RELATED APPLICATION

This application is a continuation application of International Application No. PCT/KR2021/006510, filed May 25, 2021, which claims priority to Patent Application No. 10-2020-0063073, filed on May 26, 2020 in Korea, the entire contents of which are incorporated herein by reference.

TECHNICAL FIELD

The present disclosure relates to an RF connector. More particularly, the present disclosure relates to an RF connector that delivers a radio frequency (RF) signal by using a plurality of signal transmission pins.

BACKGROUND ART

Contents described in the present section merely provide background information on the present disclosure and do not constitute the related art.

It is common to use an RF connector in order to send and receive a radio frequency (RF) signal between printed circuit boards (PCBs). In the RF connector, there are a single connector transmitting signals of one frequency and multi-connectors transmitting signals in different frequency bands. In particular, in recent years, a lot of multi-connectors have been used in order to process signals in various frequency bands.

However, sizes of conventional multi-connectors themselves are large, and due to a structure of the multi-connectors, in order to connect the PCB a height difference between the PCBs occurs and a size of a part increases on the whole.

Furthermore, there is a limit in ranges of the frequency bands which can be processed by the multi-connectors, and in order for the multi-connectors to deliver signals of a lot of frequency bands or a wide-range frequency band, a unit price of the part increases on the whole.

SUMMARY

Therefore, in order to solve the problems, a primary object of the present disclosure is to provide an RF connector which can deliver an RF signal on the same plane to reduce an overall size of a part.

Furthermore, a primary object of the present disclosure is to provide an RF connector which can process signals in various frequency bands and simultaneously reduce a unit price.

In order to accomplish such objectives an exemplary embodiment of the present disclosure provides an RF connector including: a first printed circuit board on which a plurality of devices is mounted; a first bridge assembly mounted on an area adjacent to at least one side of the first printed circuit board and including a plurality of first signal transmission pins; a second printed circuit board disposed to be spaced apart from the first printed circuit board; a plurality of connection terminals disposed at an area adjacent to at least one side of the second printed circuit board so as to be in contact with at least one surface of the plurality of first signal transmission pins; a first push bar configured to apply a force to at least one surface of the plurality of first signal transmission pins to keep the contact between the plurality of first signal transmission pins and the plurality of connection terminals; and a first metal shielding plate fixed to the first push bar and the second printed circuit board, and configured to shield at least some of the second printed circuit board and the first push bar.

As described above, according to an exemplary embodiment, by using a plurality of signal transmission pins, radio frequency (RF) signals in various frequency bands are transmitted on the same plane and may reduce a size of a part, and also reduce a manufacturing unit price as compared with a conventional RF connector.

REFERENCE NUMERALS

Figure 1:
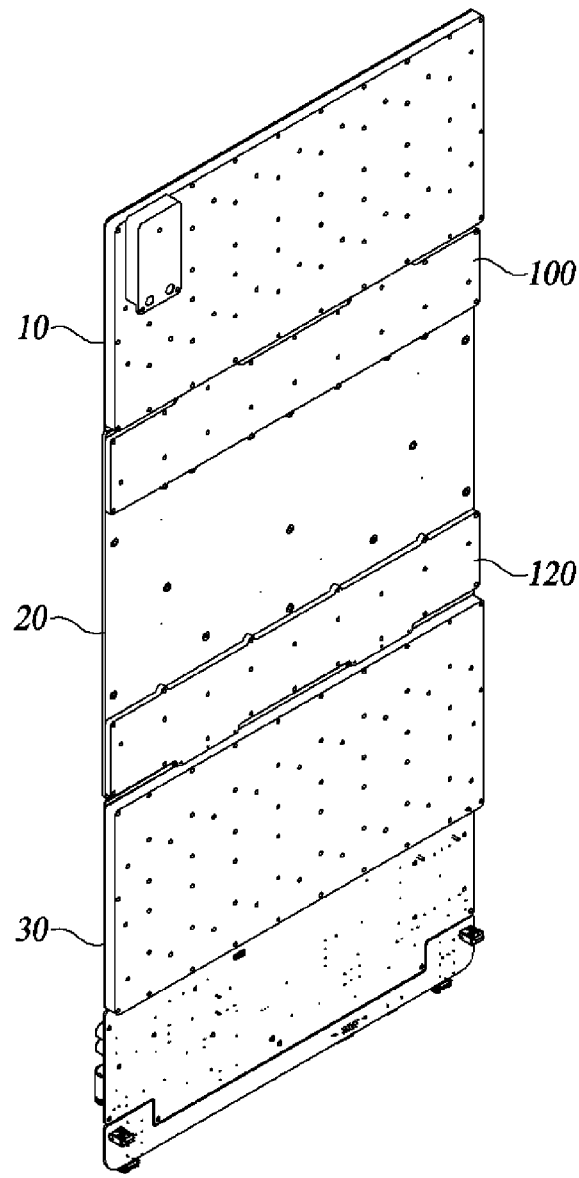
FIG. 1 is a perspective view of a printed circuit board to which a shielding plate is coupled according to an exemplary embodiment of the present disclosure.

10: first printed circuit board 260: plurality of connection terminals
20: second printed circuit board 280: bending unit
30: third printed circuit board 300: second bridge assembly
100: first metal shielding plate 320: second signal transmission pins
120: second metal shielding plate 340: second push bar
200: first bridge assembly 400: protruding unit
220: first signal transmission pins 500: plurality of shielding walls
240: first push bar

DESCRIPTION OF EXEMPLARY EMBODIMENTS

Hereinafter, some exemplary embodiments of the present disclosure will be described in detail with reference to the accompanying drawings. In the following description, like reference numerals preferably designate like elements, although the elements are shown in different drawings. Furthermore, in the following description of some embodiments, a detailed description of known functions and configurations incorporated therein will be omitted for the purpose of clarity and for brevity.

Additionally, various terms such as first, second, A, B, (a), (b), etc., are used solely to differentiate one component from the other but not to imply or suggest the substances, order, or sequence of the components. Throughout the present specification, when a part 'includes' or 'comprises' a component, the part is meant to further include other components, not to exclude thereof unless specifically stated to the contrary.

FIG. 1 is a perspective view of a printed circuit board to which a shielding plate is coupled according to an exemplary embodiment of the present disclosure.

Figure 2:
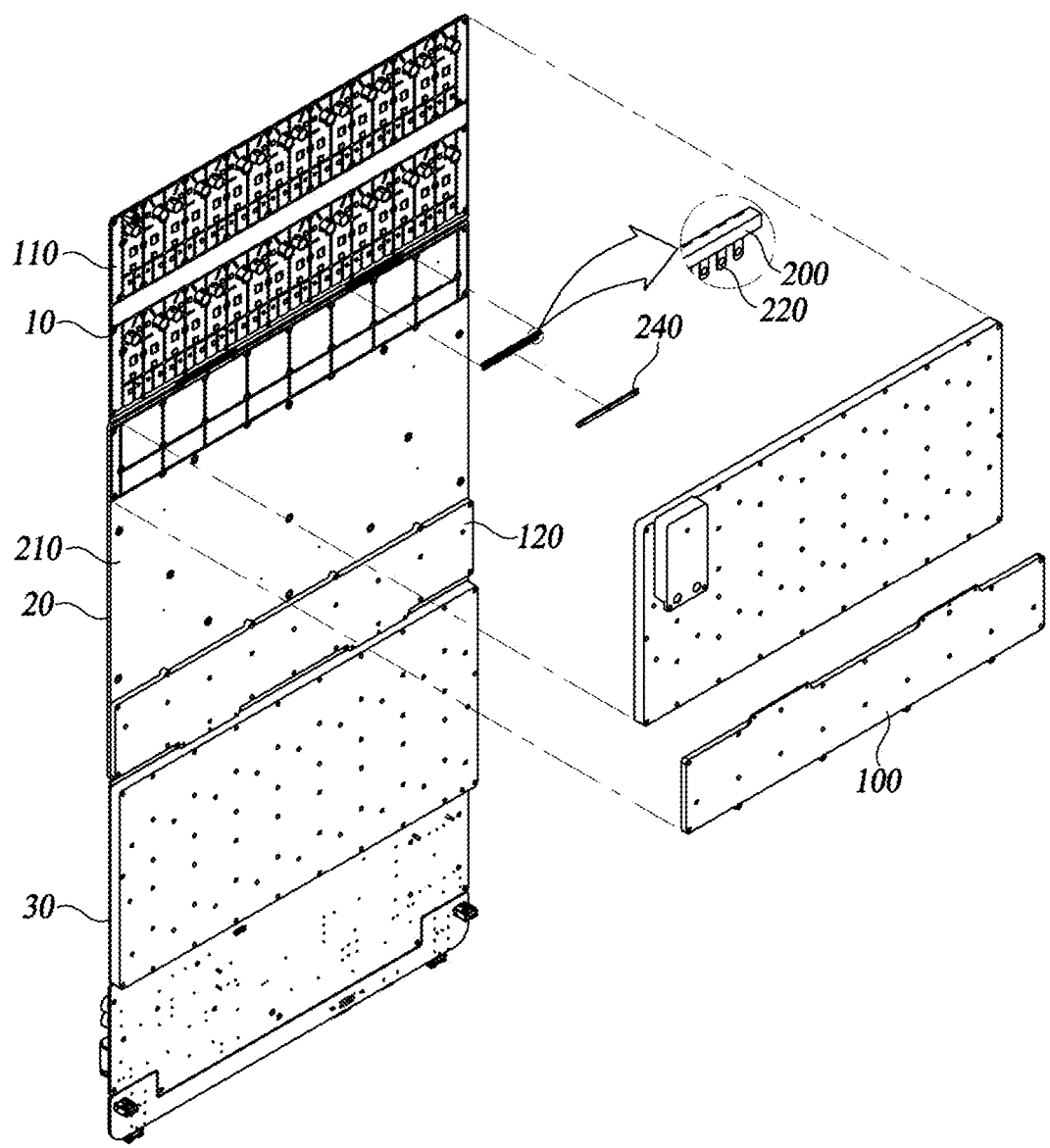
FIG. 2 is an exploded perspective view of an RF connector according to an exemplary embodiment of the present disclosure.

FIG. 2 is an exploded perspective view of an RF connector according to an exemplary embodiment of the present disclosure.

Figure 3:
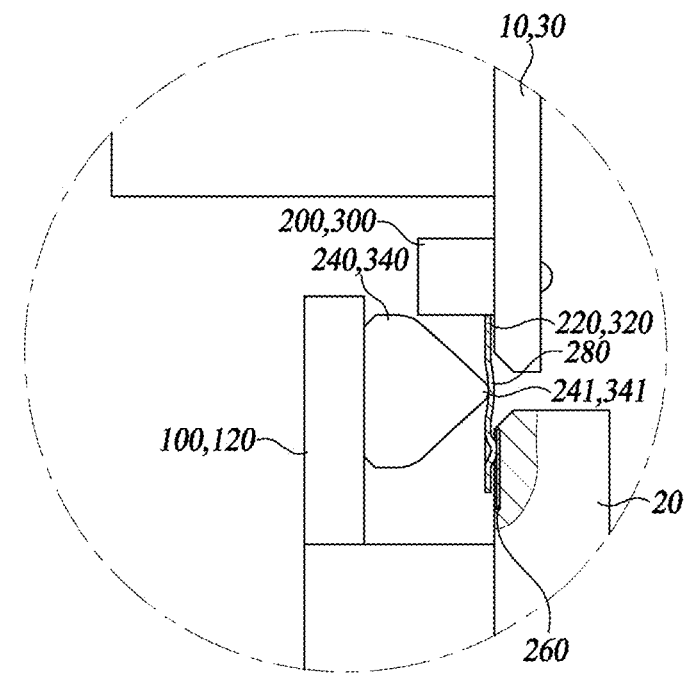
FIG. 3 is an enlarged diagram of a side surface of the RF connector according to an exemplary embodiment of the present disclosure.

FIG. 3 is an enlarged diagram of a side surface of the RF connector according to an exemplary embodiment of the present disclosure.

Figure 4:
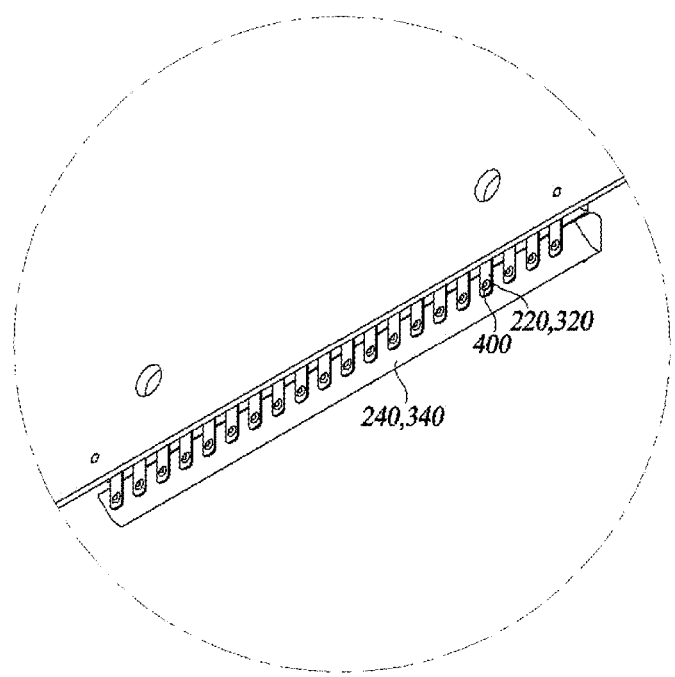
FIG. 4 is an enlarged diagram of a signal transmission pin of the RF connector according to an exemplary embodiment of the present disclosure.

FIG. 4 is an enlarged diagram of a signal transmission pin of the RF connector according to an exemplary embodiment of the present disclosure.

Figure 5:
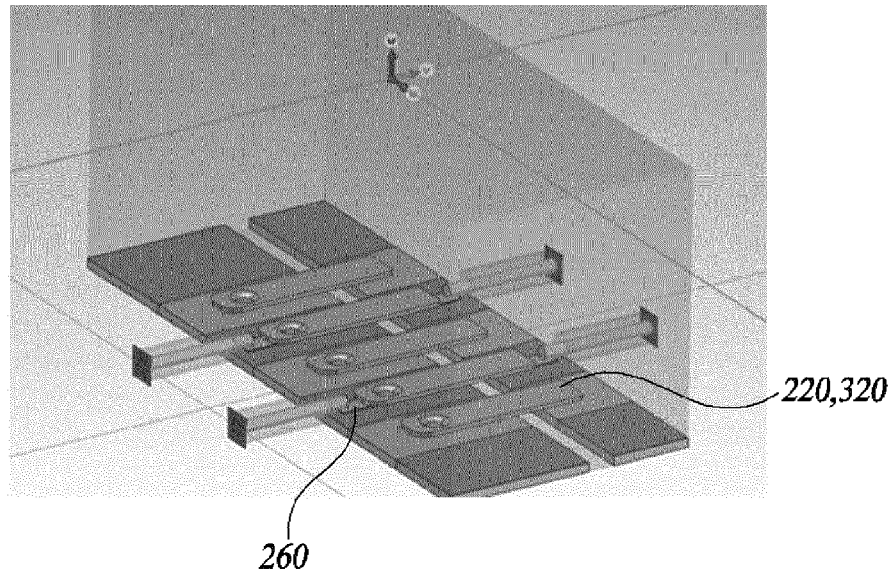
FIG. 5 is a diagram illustrating an isolation when an interval between respective signal transmission pins in which a signal is transmitted is 6 mm according to an exemplary embodiment of the present disclosure.
Figure 5:
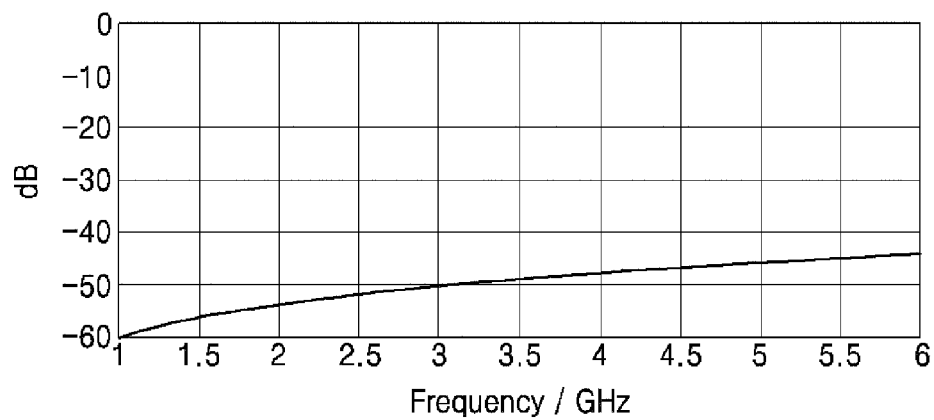

FIG. 5 is a diagram illustrating an isolation when an interval between respective signal transmission pins in which an RF signal is transmitted is 6 mm according to an exemplary embodiment of the present disclosure.

Figure 6:
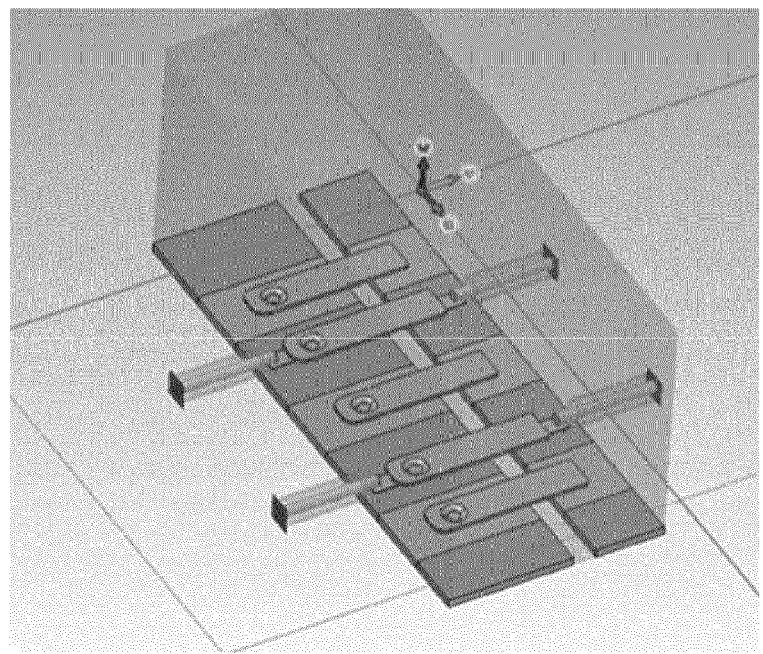
FIG. 6 is a diagram illustrating an isolation when the interval between the respective signal transmission pins in which the signal is transmitted is 8 mm according to an exemplary embodiment of the present disclosure.
Figure 6:
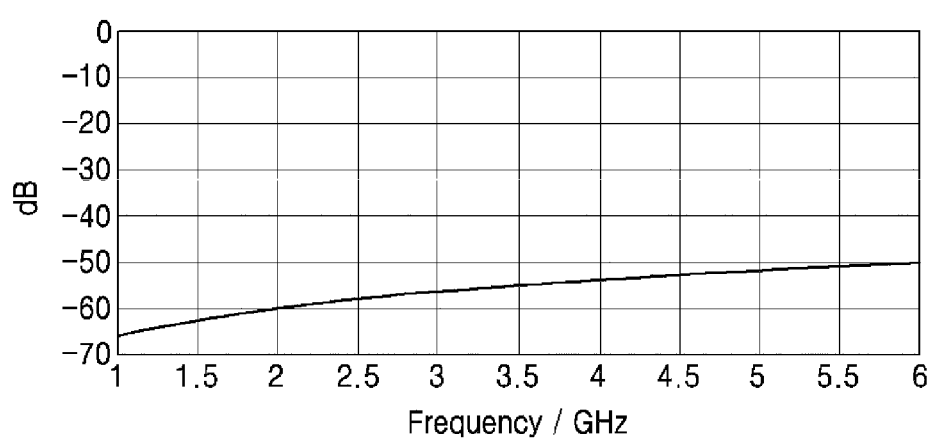

FIG. 6 is a diagram illustrating an isolation when the interval between the respective signal transmission pins in which the signal is transmitted is 8 mm according to an exemplary embodiment of the present disclosure.

Figure 7:
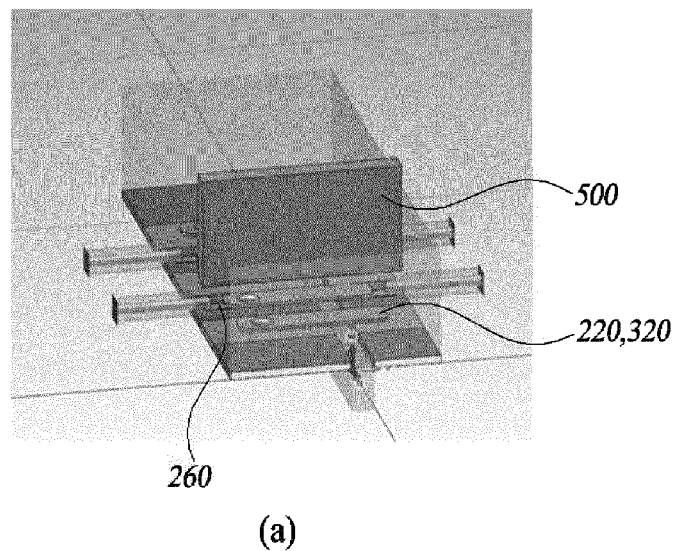
FIG. 7 is a diagram illustrating an isolation when there is a shielding wall disposed between the respective signal transmission pins in which the signal is transmitted, and the interval between the respective signal transmission pins is 6 mm according to an exemplary embodiment of the present disclosure.
Figure 7:
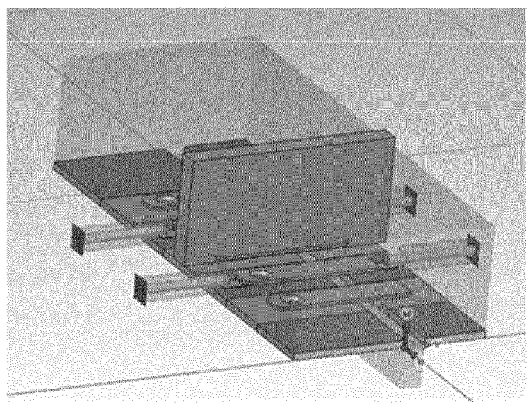
Figure 7:
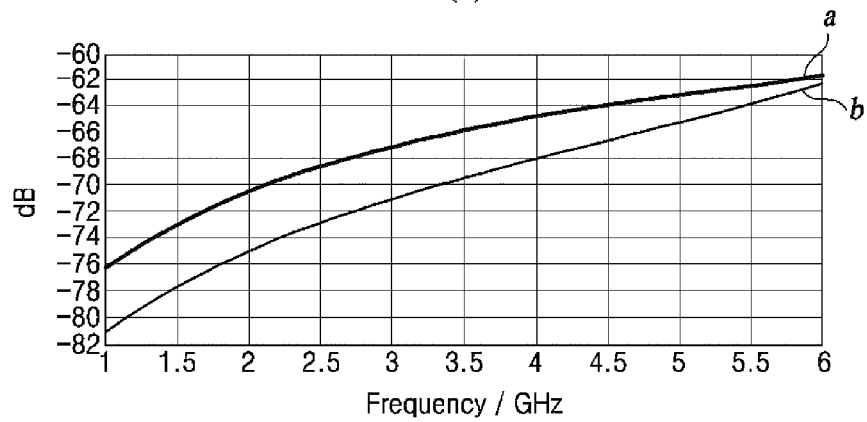

FIG. 7 is a diagram illustrating an isolation when there is a shielding wall disposed between the respective signal transmission pins in which the signal is transmitted, and the interval between the respective signal transmission pins is 6 mm according to an exemplary embodiment of the present disclosure. FIG. 7A illustrates a case where a length of the shielding wall is reduced by a manufacturing tolerance and FIG. 7B illustrates a case where the shielding wall is appropriately manufactured.

Referring to FIGS. 1 to 7, the RF connector according to an exemplary embodiment of the present disclosure may include all or some of a first printed circuit board 10, a second printed circuit board 20, a first bridge assembly 200, a plurality of first signal transmission pins 220, a plurality of connection terminals 260, a first push bar 240, a first metal shielding plate 100, and a plurality of shielding walls 500.

A plurality of devices may be mounted on the first printed circuit board 10. In the RF connector according to an exemplary embodiment of the present disclosure, the first printed circuit board 10 may be an amp board, but is not particularly limited thereto.

The second printed circuit board 20 may be disposed to be spaced apart from the first printed circuit board 10 and may have a plurality of devices mounted thereon. In the RF connector according to an exemplary embodiment of the present disclosure, the second printed circuit board 20 may be a digital board, but is not particularly limited thereto.

A first bridge assembly 200 includes a plurality of first signal transmission pins 220, and is mounted on an area adjacent to at least one side of the first printed circuit board 10. That is, the first bridge assembly 200 is configured so that the plurality of first signal transmission pins 220 may be assembled, and serves to fix one end of the plurality of first signal transmission pins 220.

The plurality of first signal transmission pins 220 becomes media which are connected to the first printed circuit board 10 and the second printed circuit board 20 to transmit and receive signals. The plurality of first signal transmission pins 220 may transmit power and digital signals in addition to the RF signals.

The plurality of first signal transmission pins 220 may be assembled to the first bridge assembly 200 at an equal interval. However, the signal transmission pins may not particularly be assembled at equal intervals, and the interval may be adjusted according to a role of each signal transmission pin.

When the interval between each signal transmission pin included in the plurality of first signal transmission pins 220 is very narrow, inter-signal interference may occur. Therefore, it is necessary to appropriately set a distance between each signal transmission pin according to a purpose. As illustrated in FIG. 5, when the distance between each signal transmission pin transmitting the signal is 6 mm, an isolation value indicates approximately 48 dB in a frequency band of 3.5 GHz. Meanwhile, as illustrated in FIG. 6, when the distance between each signal transmission pin transmitting the signal is 8 mm, the isolation value indicates approximately 55 dB in the frequency band of 3.5 GHz. Therefore, it is preferable to set the interval between each signal transmission pin transmitting the signal to 8 mm or more in order to keep the isolation value to 55 dB or more.

For example, the plurality of first signal transmission pins 220 may be constituted by approximately 80 pins, and the interval between approximately 80 pins may be configured to be constant. The number of pins is changeable according to the purpose, and since the plurality of first signal transmission pins 220 is assembled to the first bridge assembly 200 mounted on the printed circuit board, it is easy to manufacture. Therefore, as compared with the case of using the RF multi-connectors to implement the same performance, using the plurality of first signal transmission pins 220 may reduce the unit price.

A protruding unit 400 may be formed on one surface of the plurality of first signal transmission pins 220. The protruding unit 400 is formed so that the plurality of first signal transmission pins 220 may be in contact with a plurality of connection terminals 260.

The plurality of connection terminals 260 is configured for contact to be possible with at least one surface of the plurality of first signal transmission pins 220, and is disposed at an area adjacent to at least one side of the second printed circuit board 20. That is, the plurality of connection terminals 260 may also be disposed at an area adjacent to each of both sides of the second printed circuit board 20. In the RF connector according to an exemplary embodiment of the present disclosure, the plurality of connection terminals 260 may be configured as a pad type, but is not particularly limited thereto, and may also be configured as an insertion type.

The plurality of first signal transmission pins 220 may correspond to the plurality of connection terminals 260, respectively. For example, one signal transmission pin may be in contact with one connection terminal, but is not particularly limited thereto, and some of the plurality of first signal transmission pins 220 may be in contact with ground. Furthermore, each of the plurality of first signal transmission pins 220 may be in contact with one surface of each of the plurality of connection terminals 260 by overlapping.

The first push bar 240 is configured to apply force to at least one surface of the plurality of first signal transmission pins 220 to maintain the contact between the plurality of first signal transmission pins 220 and the plurality of connection terminals 260. For example, the first push bar 240 may be disposed on a surface opposite to that at which the protruding unit 400 of the plurality of first signal transmission pins 220 is positioned, i.e., the other surface. The first push bar 240 applies the force to the other surface of the plurality of first signal transmission pins 220, and as a result, the protruding unit 400 may be in contact with the plurality of connection terminals 260 without separation, and the plurality of first signal transmission pins 220 may stably transmit the signal.

The first push bar 240 may be manufactured using an insulating material. For example, the first push bar 240 may be manufactured using a plastic material, but is not particularly limited thereto.

A shape of the first push bar 240 may be a wedge shape, and a vertex of the wedge shape is positioned between the first printed circuit board 10 and the second printed circuit board 20. However, the shape of the first push bar 240 may not particularly be the wedge shape, and another shape is also possible as long as the protruding unit 400 of the plurality of first signal transmission pins 220 may solidly contact the plurality of connection terminals 260.

When the first push bar 240 has the wedge shape and the vertex of the wedge-shape applies the force to the other surface of the plurality of first signal transmission pins 220, the plurality of first signal transmission pins 220 forms a bending unit 280 between the first printed circuit board 10 and the second printed circuit board 20. As such, the bending unit 280 is formed, and as a result, the protruding unit 400 of the plurality of first signal transmission units 220 may solidly contact the plurality of connection terminals 260 according to the principle of the lever.

A first metal shielding plate 100 is fixed to the first push bar 240 and the second printed circuit board 20, and is configured to shield at least some of the second printed circuit board 20 and the first push bar 240. When the first metal shielding plate 100 is coupled to the first push bar 240, it is preferable that the first push bar 240 is coupled so that it may apply the force to one surface of the plurality of first signal transmission pins 220. A thickness of the first metal shielding plate 100 may be changed according to a noise environment around the printed circuit board, and a position at which the first metal shielding plate 100 is fixed to the second printed circuit board 20 may also be changed.

A plurality of shielding walls 500 is disposed between two first signal transmission pins adjacent to each other, and is in contact with the grounds of the first printed circuit board 10 and the second printed circuit board 20. The plurality of shielding walls 500 serves to prevent a phenomenon in which the inter-signal interference occurs between the signal transmission pins. That is, there is an effect of securing isolation between the respective signal transmission pins when the plurality of shielding walls 500 is used. The plurality of shielding walls 500 may be made of a metallic material.

When the RF connector according to an exemplary embodiment of the present disclosure includes the plurality of shielding walls 500, the first push bar 240 may be constituted by a plurality of unit push bars (not illustrated). For example, the plurality of unit push bars may be configured to be disposed at a position corresponding to one surface of each of the plurality of first signal transmission pins 220, and the plurality of shielding walls 500 may be disposed between the respective signal transmission pins. However, the present disclosure is not particularly limited to such a shape.

As illustrated in FIG. 7, when the shielding wall is formed between each signal transmission pin transmitting the signals and the distance between each signal transmission pin transmitting the signal is 6 mm, an isolation value indicates approximately 69 dB in the frequency band of 3.5 GHz. Even if a length of the shielding wall is reduced by the manufacturing tolerance, an isolation value indicates approximately 65 dB in the frequency band of 3.5 GHz. Therefore, it is preferable to form the above-described shielding wall between each signal transmission pin transmitting the signals in order to increase the isolation value.

Since it is possible to transmit the signal on the same plane between the printed circuit boards by using such a configuration, the size of the part is reduced.

Figure 8:
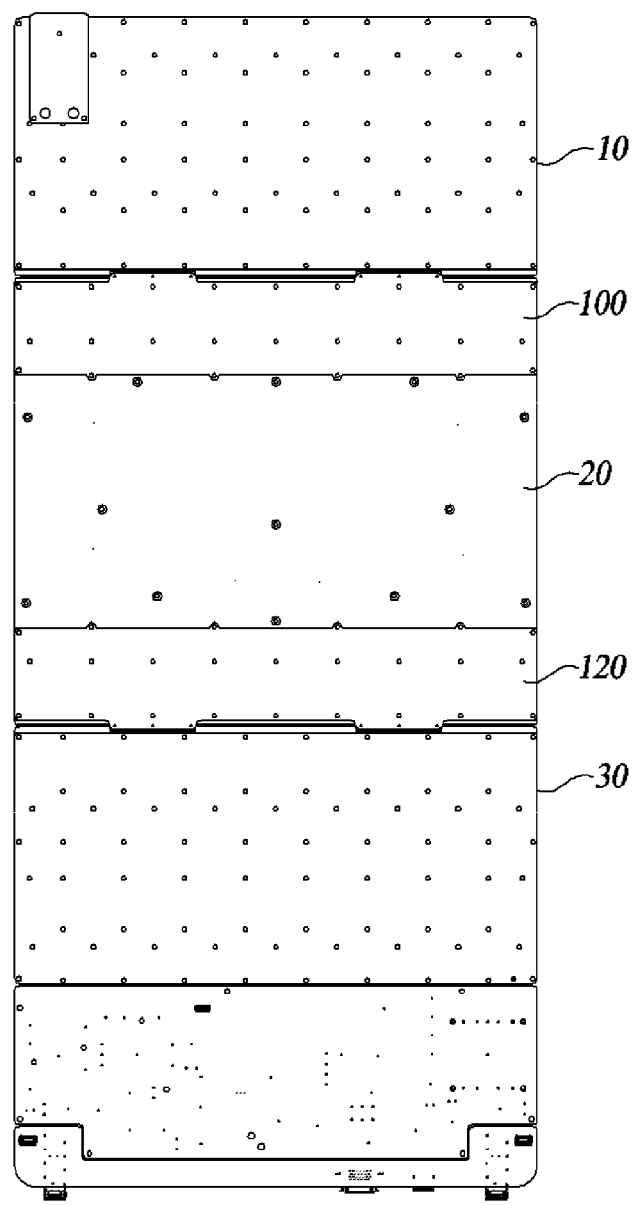
FIG. 8 is a top view of the printed circuit board to which the shielding plate is coupled according to an exemplary embodiment of the present disclosure.

FIG. 8 is a top view of the printed circuit board to which the shielding plate is coupled according to an exemplary embodiment of the present disclosure.

Referring to FIGS. 3, 4, and 8, the RF connector according to an exemplary embodiment of the present disclosure may further include all or some of a third printed circuit board 30, a second bridge assembly 300, a plurality of second signal transmission pins 320, a second push bar 340, and a second metal shielding plate 120.

The third printed circuit board 30 may be disposed to be spaced apart at a side opposite to that where the first printed circuit board 10 is positioned based on the second printed circuit board 20, and may have the plurality of devices mounted thereon. In the RF connector according to an exemplary embodiment of the present disclosure, the third printed circuit board 30 may be an amp board, but is not particularly limited thereto.

The second bridge assembly 300 includes a plurality of second signal transmission pins 320, and is mounted on an area adjacent to at least one side of the third printed circuit board 30. That is, the second bridge assembly 300 is configured so that the plurality of second signal transmission pins 320 may be assembled, and serves to fix one end of the plurality of second signal transmission pins 320.

The plurality of second signal transmission pins 320 becomes media which are connected to the second printed circuit board 20 and the third printed circuit board 30 to transmit and receive signals. The plurality of second signal transmission pins 320 may transmit the power and the digital signals in addition to the RF signals. The plurality of second signal transmission pins 320 may also transmit signals having different features from the plurality of first signal transmission pins 220 according to features of the second printed circuit board 20 and the third printed circuit board 30.

The plurality of second signal transmission pins 320 may be assembled to the second bridge assembly 300 at an equal interval. However, the signal transmission pins may not particularly be assembled at equal intervals, and the interval may be adjusted according to the role of each signal transmission pin. A description of an interval distance between each signal transmission pin in the plurality of second signal transmission pins 320 is the same as a description of the plurality of first signal transmission pins 220.

For example, the plurality of second signal transmission pins 320 may be constituted by approximately 80 pins, and the interval between approximately 80 pins may be configured to be constant. Similarly to the plurality of first signal transmission pins 220, the number of pins may be changed according to a usage, and the protruding unit 400 may be formed on one surface of the plurality of second signal transmission pins 320.

The plurality of second signal transmission pins 320 corresponds to the plurality of connection terminals 260, respectively. For example, one signal transmission pin may be in contact with one connection terminal, but is not particularly limited thereto, and some of the plurality of second signal transmission pins 320 may be in contact with the ground.

The plurality of connection terminals 260 in contact with the plurality of the second signal transmission pins is positioned at the second printed circuit board 20 and preferably positioned at an area adjacent to a side opposite to that at which the plurality of first signal transmission pins 220 is positioned. Each of the plurality of second signal transmission pins 320 may be in contact with one surface of each of the plurality of connection terminals 260 to by overlapping.

The second push bar 340 is configured to apply force to at least one surface of the plurality of second signal transmission pins 320 to maintain the contact between the plurality of second signal transmission pins 320 and the plurality of connection terminals 260. Similarly to the first push bar 240, the second push bar 340 may be disposed on a surface opposite to that at which the protruding unit 400 of the plurality of second signal transmission pins 320 is positioned, i.e., the other surface.

The shape of the second push bar 340 may be, for example, the wedge shape, and the vertex of the wedge shape is positioned between the second printed circuit board 20 and the third printed circuit board 30. However, the shape of the second push bar 340 may not particularly be the wedge shape, and another shape is also possible as long as the protruding unit 400 of the plurality of second signal transmission pins 320 may solidly contact the plurality of connection terminals 260.

When the second push bar 340 has the wedge shape and the vertex of the wedge-shape applies the force to the other surface of the plurality of second signal transmission pins 320, the plurality of second signal transmission pins 320 forms a bending unit 280 between the second printed circuit board 20 and the third printed circuit board 30. As such, the bending unit 280 is formed, and as a result, the protruding unit 400 of the plurality of second signal transmission pins 320 may solidly contact the plurality of connection terminals 260 according to the principle of the lever.

The second push bar 340 may be manufactured using an insulating material. For example, the second push bar 240 may be manufactured using the plastic material, but is not particularly limited thereto.

A second metal shielding plate 120 is fixed to the second push bar 340 and the second printed circuit board 20, and is configured to shield at least some of the second printed circuit board 20 and the second push bar 340. When the second metal shielding plate 120 is coupled to the second push bar 340, it is preferable that the second push bar 340 is coupled so that it may apply the force to one surface of the plurality of second signal transmission pins 320. The thickness of the second metal shielding plate 120 may be changed according to a noise environment around the printed circuit board, and a position at which the second metal shielding plate 120 is fixed to the second printed circuit board 20 may also be changed.

In addition to the first metal shielding plate 100 and the second metal shielding plate 120, a separate metal shielding plate covering the first printed circuit board 10 and the third printed circuit board 30 may be further coupled. As a result, noise may be prevented from interfering with a path in which a radio signal is transmitted.

Furthermore, the RF connector may further include a plurality of shielding walls 500 which is disposed between two second signal transmission pins adjacent to each other, and is in contact with the grounds of the second printed circuit board 20 and the third printed circuit board 30. The description of the plurality of shielding walls 500 is described above.

The bridge assembly, the signal transmission pin, the push bar, and the shielding wall of the RF connector according to an exemplary embodiment of the present disclosure may be used between each of the printed circuit boards, for example two may be used. However, two may not particularly be used, and it is possible to use one or three or more according to the usage.

As described above, the RF connector according to an exemplary embodiment of the present disclosure may minimize the size of the part by transmitting signals on the same plane using a plurality of signal transmission pins. Furthermore, compared to a case in which a multi-connector is used, manufacturing is easier and the unit price of the part becomes relatively lower.

Although exemplary embodiments of the present disclosure have been described for illustrative purposes, those skilled in the art will appreciate that various modifications, additions, and substitutions are possible, without departing from the idea and scope of the claimed invention. Therefore, exemplary embodiments of the present disclosure have been described for the sake of brevity and clarity. The scope of the technical idea of the present embodiments is not limited by the illustrations. Accordingly, one of ordinary skill would understand that the scope of the claimed invention is not to be limited by the above explicitly described embodiments but by the claims and equivalents thereof.

What is claimed is:

1. An RF connector comprising:
   a first printed circuit board on which a plurality of devices is mounted;
   a first bridge assembly mounted on an area adjacent to at least one side of the first printed circuit board and including a plurality of first signal transmission pins;
   a second printed circuit board disposed to be spaced apart from the first printed circuit board;
   a plurality of connection terminals disposed at an area adjacent to at least one side of the second printed circuit board so as to be in contact with at least one surface of the plurality of first signal transmission pins;
   a first push bar configured to apply a force to at least one surface of the plurality of first signal transmission pins to keep the contact between the plurality of first signal transmission pins and the plurality of connection terminals; and
   a first metal shielding plate fixed to the first push bar and the second printed circuit board, and configured to shield at least some of the second printed circuit board and the first push bar.

2. The RF connector of claim 1, comprising:
   a plurality of shielding walls disposed between two first signal transmission pins adjacent to each other,
   wherein the plurality of shielding walls is in contact with grounds of the first printed circuit board and the second printed circuit board.

3. The RF connector of claim 1, wherein the plurality of first signal transmission pins is assembled to the first bridge assembly at an equal interval.

4. The RF connector of claim 1, wherein the plurality of first signal transmission pins corresponds to the plurality of connection terminals, respectively, and the plurality of first signal transmission pins is in contact with one surface of the plurality of connection terminals to be overlapped.

5. The RF connector of claim 1, wherein a protruding unit which is in contact with the plurality of connection terminals is formed on one surface of each of the plurality of first signal transmission pins.

6. The RF connector of claim 5, wherein the first push bar is configured to apply force to the other surface of the plurality of first signal transmission pins.

7. The RF connector of claim 6, wherein the first push bar has a wedge shape, and a wedge-shaped vertex is positioned between the first printed circuit board and the second printed circuit board.

8. The RF connector of claim 7, wherein the plurality of first signal transmission pins forms a bending unit between the first printed circuit board and the second printed circuit board.

9. The RF connector of claim 1, wherein the plurality of first signal transmission pins transmits an RF signal, power, and a digital signal.

10. The RF connector of claim 1, wherein the plurality of connection terminals is configured as a pad type.

11. The RF connector of claim 1, wherein the first push bar is made of a plastic material.

12. The RF connector of claim 1, wherein the first printed circuit board is an amp board, and
the second printed circuit board is a digital board.

13. The RF connector of claim 1, further comprising:
a third printed circuit board disposed to be spaced apart from an opposite side where the first printed circuit board is positioned based on the second printed circuit board, and mounted with a plurality of devices;
a second bridge assembly mounted on an area adjacent to at least one side of the third printed circuit board and including a plurality of second signal transmission pins;
a second push bar configured to apply force to at least one surface of the plurality of second signal transmission pins to keep the contact between the plurality of second signal transmission pins and the plurality of connection terminals; and
a second metal shielding plate fixed to the second push bar and the second printed circuit board, and configured to shield at least some of the second printed circuit board and the second push bar.

14. The RF connector of claim 13, wherein the third printed circuit board is the amp board.

* * * * *